(12) United States Patent
Lee et al.

(10) Patent No.: US 12,063,757 B2
(45) Date of Patent: Aug. 13, 2024

(54) HEAT SINK

(71) Applicant: LG INNOTEK CO., LTD., Seoul (KR)

(72) Inventors: Mi Sun Lee, Seoul (KR); Yong Joo Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 202 days.

(21) Appl. No.: 17/918,694

(22) PCT Filed: Apr. 14, 2021

(86) PCT No.: PCT/KR2021/004710
§ 371 (c)(1),
(2) Date: Oct. 13, 2022

(87) PCT Pub. No.: WO2021/210914
PCT Pub. Date: Oct. 21, 2021

(65) Prior Publication Data
US 2023/0102931 A1    Mar. 30, 2023

(30) Foreign Application Priority Data

Apr. 14, 2020 (KR) .......................... 1020200045547

(51) Int. Cl.
H05K 7/20 (2006.01)
(52) U.S. Cl.
CPC ..... H05K 7/20509 (2013.01); H05K 7/20336 (2013.01)
(58) Field of Classification Search
CPC ................. H05K 7/20336; H05K 7/20509
See application file for complete search history.

(56) References Cited

U.S. PATENT DOCUMENTS 6,626,233 B1 * 9/2003 Connors ............. F28D 15/0233
174/16.3
9,236,323 B2   1/2016 Jones et al.
(Continued)

FOREIGN PATENT DOCUMENTS

KR   10-2012-0100675    9/2012
KR      10-1504744      3/2015
(Continued)

OTHER PUBLICATIONS

International Search Report dated Jul. 27, 2021 issued in Application No. PCT/KR2021/004710.

*Primary Examiner* — Mukundbhai G Patel
(74) *Attorney, Agent, or Firm* — KED & ASSOCIATES, LLP (57) ABSTRACT

The present invention relates to a heat sink comprising a heat pipe. A heat sink, according to one embodiment of the present invention, comprises: a first heat pipe mounted in a first groove formed on a first surface of a heat sink; a second heat pipe mounted in a second groove formed on a second surface of the heat sink; and a third groove in which at least a portion of the second heat pipe mounted in the second groove is exposed in the direction of the first surface. A method for producing a heat sink comprises the steps of: forming, on a first surface of a heat sink, a first groove in which a first heat pipe is mounted; mounting the first heat pipe on the first surface by disposing and press-fitting the first heat pipe in the first groove; forming, on a second surface of the heat sink, a second groove in which a second heat pipe is mounted; mounting the second heat pipe on the second surface by disposing and press-fitting the second heat pipe in the second groove; and forming a third groove such that at least a portion of the second heat pipe is exposed in the direction of the first surface.

18 Claims, 6 Drawing Sheets

(56) References Cited

U.S. PATENT DOCUMENTS

| | | | |
|---|---|---|---|
| 2014/0182817 A1* | 7/2014 | Yu | F28D 15/0275 |
| | | | 165/104.21 |
| 2016/0227668 A1* | 8/2016 | Wang | H05K 7/20727 |
| 2018/0283797 A1* | 10/2018 | Tochigi | F28D 15/0233 |

FOREIGN PATENT DOCUMENTS

| | | |
|---|---|---|
| KR | 10-2017-0038862 | 4/2017 |
| KR | 10-1894820 | 9/2018 |

* cited by examiner

HEAT SINK

CROSS-REFERENCE TO RELATED PATENT APPLICATIONS

This application is a U.S. National Stage Application under 35 U.S.C. § 371 of PCT Application No. PCT/KR2021/004710, filed Apr. 14, 2021, which claims priority to Korean Patent Application No. 10-2020-0045547, filed Apr. 14, 2020, whose entire disclosures are hereby incorporated by reference.

TECHNICAL FIELD

The present invention relates to a heat sink, and more particularly, to a heat sink including a heat pipe.

BACKGROUND ART

In order to dissipate heat from products that generate a lot of heat, such as converters, various methods such as various fins and fans, thermoelectric elements, cooling water circulation, and heat pipes have been used.

A heat pipe is a pipe-shaped heat exchanger containing a working fluid inside that efficiently transfers heat between the interface of two solids by combining the principles of thermal conductivity and phase transition. In a structure using a heat pipe, a sub heat sink for offsetting the height is used in order to lower the heat of heat generating components having different heights.

When using a sub heat sink, heat loss occurs due to the sub heat sink, material cost increases, and there is a limitation in slimming of the product. In order to solve this problem, there is a need for a heat dissipation technology with high heat dissipation efficiency that can be applied to heat generating components having different heights.

DETAILED DESCRIPTION OF THE INVENTION

Technical Subject

The technical problem to be solved by the present invention is to provide a heat sink including a heat pipe and a method of manufacturing the heat sink.

The subjects of the present invention are not limited to the subjects mentioned above, and other subjects not mentioned will be clearly understood by those skilled in the art from the following description.

Technical Solution

In order to solve the above technical problem, a heat sink according to an embodiment of the present invention includes: a first heat pipe being mounted in a first groove formed in a first surface of the heat sink; a second heat pipe being mounted in a second groove formed in a second surface of the heat sink; and a third groove in which at least a portion of a second heat pipe being mounted in the second groove is exposed in a direction toward the first surface.

In addition, the first heat pipe and the second heat pipe may have a step difference in a direction toward the first surface.

In addition, when the heat sink is applied to a product, the first heat pipe is in contact with a first heating component in the first surface, and the second heat pipe may be in contact with a second heating component through the third groove.

In addition, the third groove may be formed to be greater than or equal to the area of the surface of the second heat generating component being in contact with the second heat pipe.

In addition, the height of the first heating component may be lower than the height of the second heating component.

In addition, the first heat pipe and the third groove may be spaced apart from each other by a predetermined distance or more.

In addition, the first groove includes a locking portion for preventing the first heat pipe from departing in a direction toward the first surface, and the second groove may include a locking portion for preventing the second heat pipe from being separated toward the second surface direction.

In order to solve the above technical problem, a method for manufacturing a heat sink according to an embodiment of the present invention may comprise the steps of: forming a first groove in which a first heat pipe is mounted in a first surface of a heat sink; mounting the first heat pipe in the first surface by disposing the first heat pipe in the first groove and press-fitting the first heat pipe; forming a second groove in which a second heat pipe is mounted in a second surface of the heat sink; mounting the second heat pipe in the second surface by disposing the second heat pipe in the second groove and press-fitting the second heat pipe; and forming a third groove such that at least a portion of the second heat pipe is exposed toward the direction of the first surface.

In addition, the method may include the steps of: forming a locking portion by undercutting the first groove in a direction toward the first surface; and forming a locking portion by undercutting the second groove in a direction toward the second surface.

In addition, in the step of forming the third groove, the third groove may be formed so that the first heat pipe and the second heat pipe have a step difference in a direction toward the first surface.

In addition, in the step of forming the third groove, the third groove may be formed to be spaced apart from the first heat pipe by a predetermined distance or more.

In addition, at least one among the first groove, the second groove, and the third groove may be formed by performing numerical control (NC) cutting.

Advantageous Effects

According to embodiments of the present invention, heat dissipation performance can be improved, material costs can be reduced, and slimming of the product become possible.

The effect according to the invention is not limited by the contents exemplified above, and more various effects are included in the present specification.

BRIEF DESCRIPTION OF DRAWINGS

FIGS. 4 (A) to (I) and 5 (A) to (D) are diagrams for explaining a process of manufacturing a heat sink according to an embodiment of the present invention.

BEST MODE

Hereinafter, preferred embodiments of the present invention will be described in detail with reference to the accompanying drawings.

However, the technical idea of the present invention is not limited to some embodiments to be described, but may be implemented in various forms, and within the scope of the technical idea of the present invention, one or more of the constituent elements may be selectively combined or substituted between embodiments.

In addition, the terms (including technical and scientific terms) used in the embodiments of the present invention, unless explicitly defined and described, can be interpreted as a meaning that can be generally understood by a person skilled in the art, and commonly used terms such as terms defined in the dictionary may be interpreted in consideration of the meaning of the context of the related technology.

In addition, terms used in the present specification are for describing embodiments and are not intended to limit the present invention.

In the present specification, the singular form may include the plural form unless specifically stated in the phrase, and when described as "at least one (or more than one) of A and B and C", it may include one or more of all combinations that can be combined with A, B, and C.

In addition, in describing the components of the embodiment of the present invention, terms such as first, second, A, B, (a), and (b) may be used. These terms are merely intended to distinguish the components from other components, and the terms do not limit the nature, order or sequence of the components.

And, when a component is described as being 'connected', 'coupled' or 'interconnected' to another component, the component is not only directly connected, coupled or interconnected to the other component, but may also include cases of being 'connected', 'coupled', or 'interconnected' due that another component between that other components.

In addition, when described as being formed or arranged in "on (above)" or "below (under)" of each component, "on (above)" or "below (under)" means that it includes not only the case where the two components are directly in contact with, but also the case where one or more other components are formed or arranged between the two components. In addition, when expressed as "on (above)" or "below (under)", the meaning of not only an upward direction but also a downward direction based on one component may be included.

Figure 1:
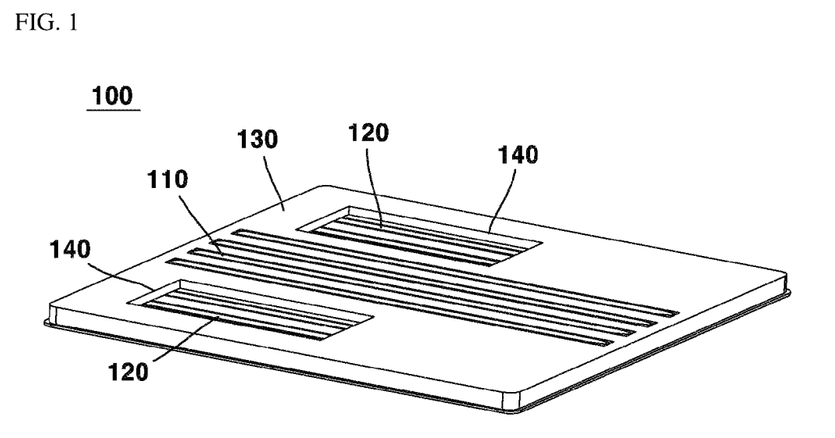
FIG. 1 illustrates a heat sink according to an embodiment of the present invention.

FIG. 1 illustrates a heat sink according to an embodiment of the present invention.

The heat sink 100 according to an embodiment of the present invention performs heat dissipation using a heat pipe. A groove is formed in the heat sink 100, and a heat pipe is press-fitted into the formed groove and mounted. The heat pipe is mounted at the same height as the mounting surface of the heat sink 100, and receives heat from the heat dissipation component being in contact with the heat sink 100 to play the role of lowering the heat of the heat sink 100.

The heat sink 100 according to an embodiment of the present invention includes: a first heat pipe 110 being mounted in a first groove being formed in a first surface 130 of the heat sink 100; and a second heat pipe 120 being mounted in a second groove being formed in a second surface 150 of the heat sink 100, wherein the second heat pipe 120 being mounted in a second groove includes a third groove 140 in which at least a portion is exposed in a direction toward a first surface 130.

The first heat pipe 110 and the second heat pipe 120 are formed of the same heat pipe, only the surface mounted on the heat sink 100 is different, and it is divided into different first and second heat pipes in order to distinguish the mounting surface.

Figure 2:
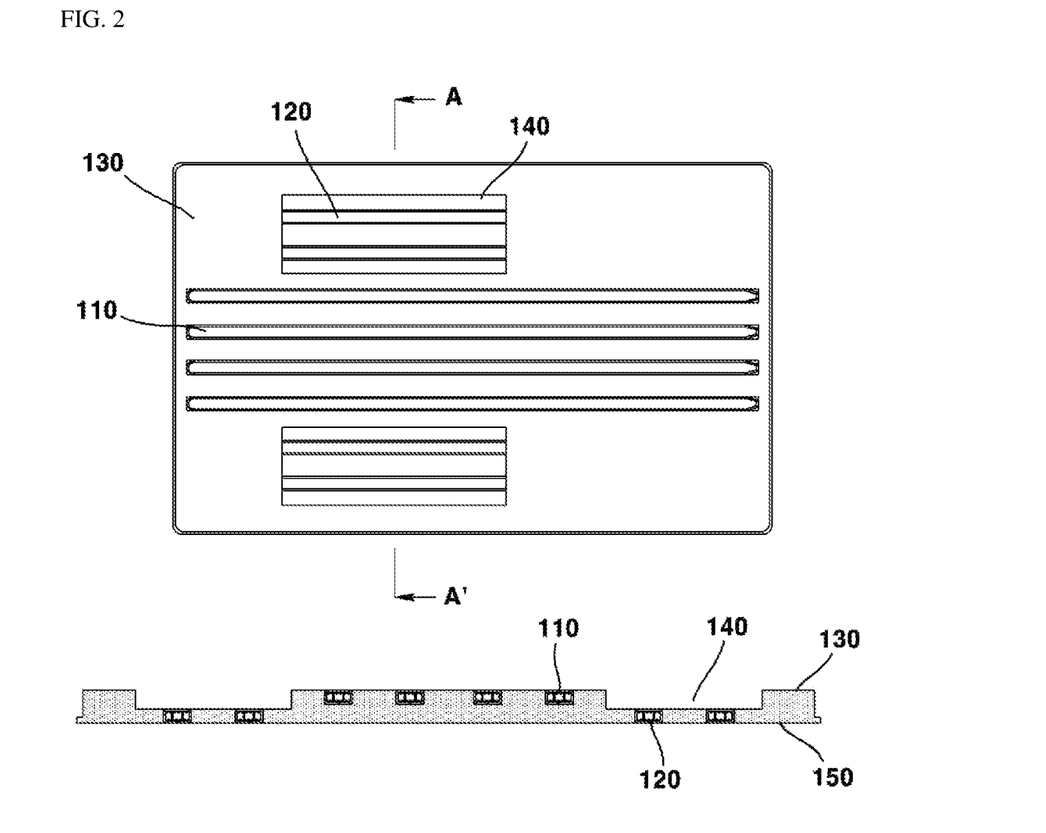
FIG. 2 is a top view and a cross-sectional view of a heat sink according to an embodiment of the present invention.

FIG. 2 is a top view viewed from the first surface of the heat sink 100 and a cross-sectional view taken along section A-A'. The first heat pipe 110 is mounted in a groove formed in a first surface 130. The first groove being formed in a first surface 130 is in the form of a groove formed to a predetermined depth, but it is not in the form of a hole penetrating from the first surface 130 to the second surface 150, and the cross-sectional area of the first groove is formed to be the same as the cross-sectional area of the first heat pipe 110 or is formed to be larger by a predetermined area, so that the first heat pipe 110 is press-fitted into the first groove to be mounted at the same height as a first surface 130.

The second heat pipe 120 is mounted in a groove formed in a second surface 150 which is an opposite surface of the first surface 130. The second groove being formed in the second surface 150 is in the form of a groove formed to a predetermined depth, but not in the form of a hole penetrating from the second surface 150 to the first surface 130, and the cross-sectional area of the second groove is formed to be the same as the cross-sectional area of the second heat pipe 120 or is formed to be larger by a predetermined area, so that the second heat pipe 120 is press-fitted into the second groove to be mounted at the same height as the second surface 150.

The third groove 140 being formed in a first surface is formed to a depth up to the second heat pipe 120 in a partial area so that the second heat pipe 120 being mounted in a second surface 150 is exposed toward the first surface 130 in an opposite surface of a second surface in which the second heat pipe 120 is mounted. That is, it is formed so that at least a portion of a second heat pipe 120 is exposed in a third groove 140 when viewed from a first surface 130.

The first heat pipe 110 and the second heat pipe 120 may have a step difference in the direction toward the first surface 130. Since the first heat pipe 110 and the second heat pipe 120 are formed in a groove having a predetermined depth without penetrating the heat sink 100, the distance from the first surface 130 or the second surface 150 to each heat pipe may be different. That is, even if the second heat pipe 120 is exposed to the first surface 130 through the third groove 140, it has a height that is deeper than the first surface 130 which is not the same height as the first heat pipe 110 being formed in the first surface 130 at the same height as the first surface 130. That is, the first heat pipe 110 and the second heat pipe 120 have a step difference in a direction toward a first surface 130. Here, the height of the step difference between the first heat pipe 110 and the second heat pipe 120 may vary depending on the thickness of the heat sink 100, the height being formed at which the second heat pipe 120 is mounted on a second surface 150.

Figure 3:
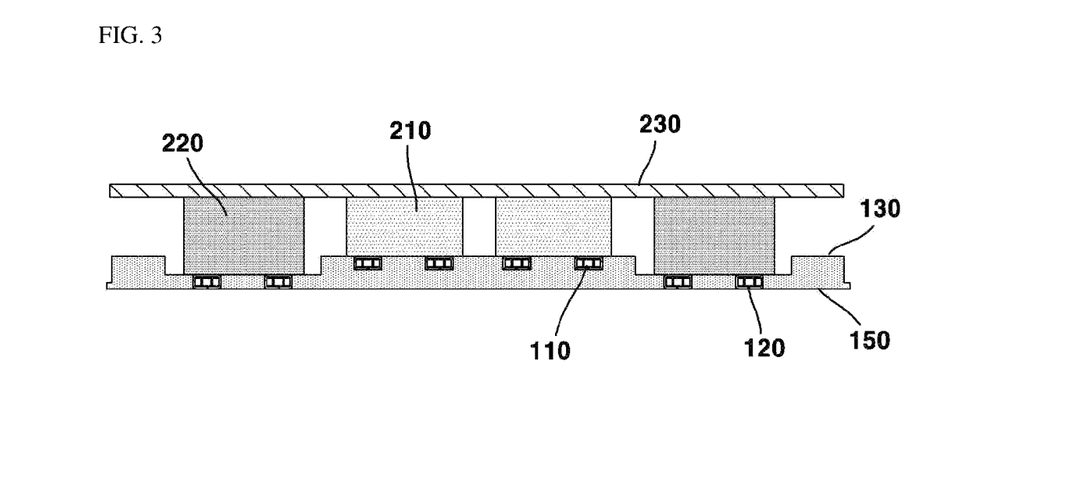
FIG. 3 is a diagram for explaining an example in which a heat sink according to an embodiment of the present invention is applied to a product.

When the heat sink 100 is applied to the product, the first heat pipe 110 is in contact with the first heating component 210 in a first surface 130, and the second heat pipe 120 in contact with the second heating component 220 through a third groove 140. FIG. 3 illustrates an example being applied to a product in a heat sink 100, and a product to which the heat sink 100 is applied may include a plurality of components formed in one printed circuit board 230, and some components generate heat and may be the components that require heat dissipation. At this time, the heat pipe may be in contact with the heat generating component for heat dissipation. At this time, the height of the heating component may be different. At this time, according to the difference in height between the components, the heat-generating components having a low height based on the high-height heating components use a sub heat sink to reinforce the height for contact with a heat pipe. However, since indirect contact is made through the sub heat sink rather than direct contact with the heat pipe, there are problems in that heat loss occurs, material cost increases, and slimming of the product is limited by using a sub heat sink.

In order to solve this, the first heat pipe 110 is disposed so that the first heat generating part 210 with a low height is in contact, and the second heat pipe 120 may be disposed such that the second heat generating component 220 having a large height is in contact. As described previously, the first heat pipe 110 and the second heat pipe 120 have a step difference in a direction toward the first surface 130, and when the heating components is in contact with a first surface 130 of the heat sink 100, since the gap between the first heat pipe 110 and the printed circuit board 230 is shorter than the gap between the second heat pipe 120 and the printed circuit board 230 based on the printed circuit board 230 on which the heating components are mounted, the first heat pipe 110 is disposed so that the first heating component with a low height is in contact, and the second heat pipe 120 may be disposed such that the second heat generating component 220 having a large height is in contact. Through this, it is possible to increase the efficiency of heat dissipation through direct contact with the heat pipe for heating components of different heights, material cost can be reduced, and product slimming is possible.

Since the second heat pipe 120 should be in contact with the second heating component 220, the third groove 140 may be formed to be greater than the width of the surface of the second heating component 220 being in contact with the second heat pipe 120. The third groove 140 may play the role of the component seating part which is in contact with the second heat pipe 120 when the second heating component is seated.

The height of the first heating component 210 is lower than the height of the second heating component 220, and the step difference in a direction toward a first surface 130 of the first heat pipe 110 and the second heat pipe 120 may be formed as much as the height difference between the first heating component 210 and the second heating component 220. The step difference between the first heat pipe 110 and the second heat pipe 120 may vary according to the thickness of the heat sink 100, the height when the second heat pipe 120 is mounted, and the depth of the third groove 140, and the step difference in a direction toward a first surface 130 of the first heat pipe 110 and the second heat pipe 120 may be adjusted by adjusting at least one among these. The thickness of the heat sink 100 is adjusted, or the height being reduced by applying pressure when the second heat pipe 120 is press-fitted can be adjusted differently. In addition, the depth of the third groove 140 may be adjusted differently. Not only the height difference between the first heating component 210 and the second heating component 220, but also the step difference about heat-generating parts of various heights can be applied differently to the different heating components based on the tallest heating element.

When it is difficult to form a height difference between heating components due to the step difference in a direction toward the first surface 130 of the first heat pipe 110 and the second heat pipe 120, or for heating components with various heights, it is natural that the height difference can be reinforced by using a sub heat sink. Even when using a sub heat sink, the height of the sub heat sink can be reduced rather than reinforcing the height difference with the existing sub heat sink alone, and therefore, it is possible to greatly reduce the side effects caused by using the sub heat sink.

Since both the first surface 130 and the second surface 150 of the second heat pipe 120 are exposed at the position where the third groove 140 is formed, the heat dissipation effect may be greater than that of the first heat pipe 110. Therefore, it is also possible to implement efficient heat dissipation for heat-generating components that generate a lot of heat by disposing it to be in contact with the second heat pipe 120. That is, various designs are possible according to the magnitude of the heat being generated or the importance of the component as well as the height of the heat generating component.

Figure 4:
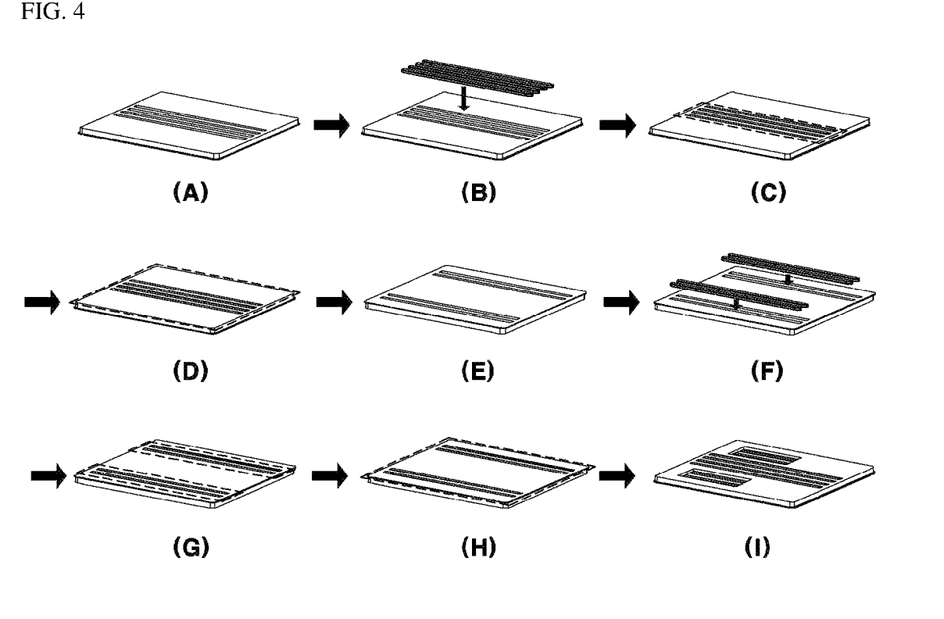
Figure 5:
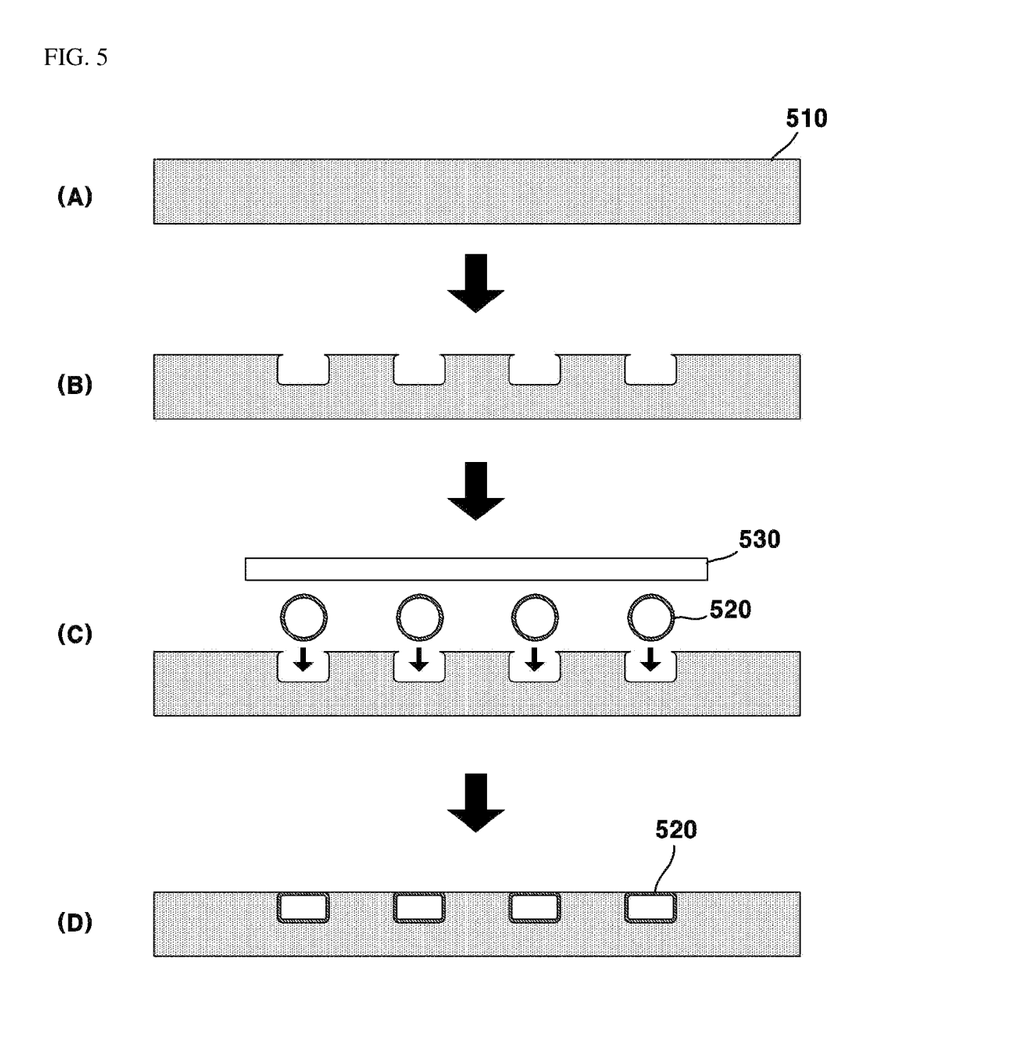
Figure 6:
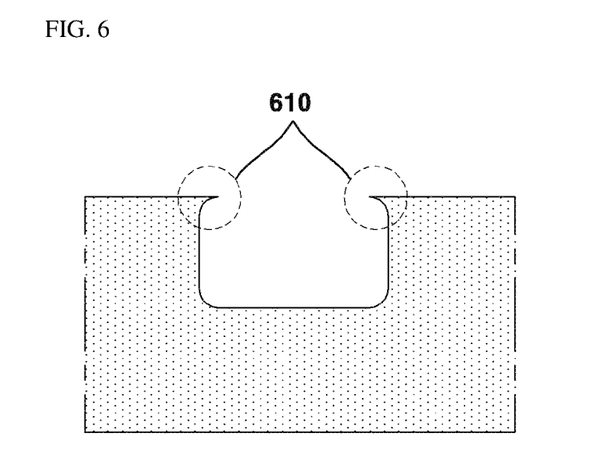
FIGS. 6 to 8 are diagrams for explaining a heat sink according to an embodiment of the present invention.
Figure 7:
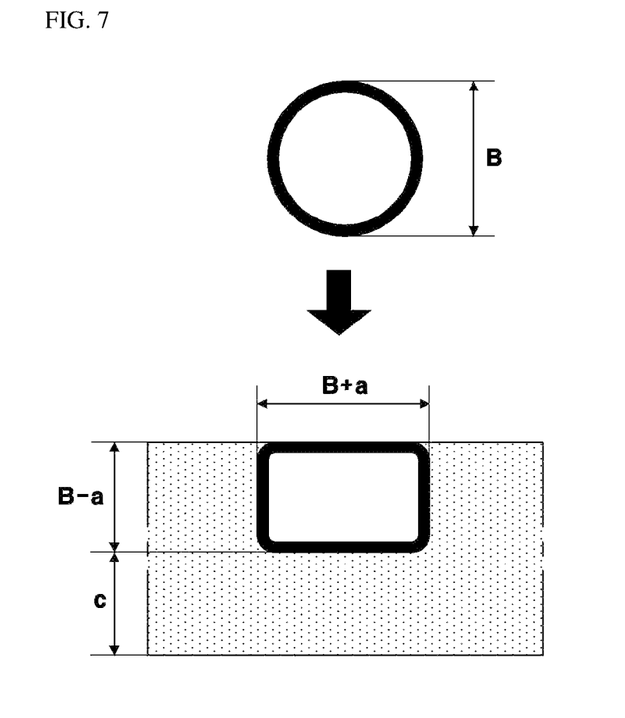

FIG. 4 illustrates a method for manufacturing a heat sink 100 according to an embodiment of the present invention. First, a first groove is formed (4A) through numerical control (NC) cutting at a position where the first heat pipe is to be mounted on a first surface of the heat sink 100. It is natural that various cutting methods can be used in addition to numerical control cutting. Thereafter, the first heat pipe 110 is seated (4B) in the first groove, and the first heat pipe 110 is press-fitted (4C) by pressing the first heat pipe 110 with a jig. At this time, the first heat pipe 110 may be press-fitted into the first groove through the process shown in FIG. 5. First, a heat sink 100 is formed by an extrusion process (5A), and a first groove into which the heat pipe is to be press-fitted is formed (5B) through numerical control (NC) cutting. At this time, as shown in FIG. 6, after press-fitting the first heat pipe 110 by applying an undercut to the edge in a direction toward the first surface, the first heat pipe 110 forms a locking portion 610 that prevents separation in a direction toward the first surface 130. Thereafter, the first heat pipe 110 having a circular shape is introduced into the first groove, and the first heat pipe 110 is press-fitted with a jig (5C) so that the first heat pipe 110 has the shape of the first groove. The cross-section is deformed to be the first groove shape through press-fitting, and the first heat pipe 110 is mounted (5D) on the first surface 130 so that a portion thereof is exposed to the first surface 130. When press-fitting, as shown in FIG. 7, the first heat pipe 110 having a circular cross section with a diameter B is deformed to have a rectangular cross section having a width of B+a and a height of B−a by press-fitting. For example, B may be 6 mm and a may be 2 mm. That is, a circular cross-section with a diameter of 6 mm can be deformed to have a cross-section of 8×4. At this time, the gap to the second surface 150 may be formed to be c. Here, the distance c up to the second surface 150 corresponds to the depth of the third groove 140, and may be the step difference in a direction toward the first surface 130 of the first heat pipe 110 and the second heat pipe 120. Here, c may deform the cross-section of the first heat pipe 110 to have 3 mm or more.

Figure 8:
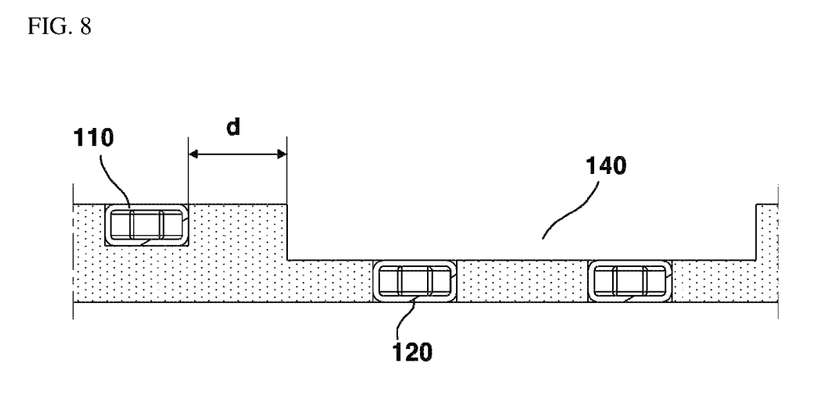

Again, referring to the manufacturing process of FIG. 4, after press-fitting (4C) the first heat pipe 110 into the first groove, the first surface 130 on which the first heat pipe 110 is mounted is flattened and compensated through numerical control cutting (4D). Thereafter, a second groove is formed (4E) in a second surface 150 of the heat sink 100 through numerical control (NC) cutting at a position where the second heat pipe is to be mounted. Thereafter, the second heat pipe 120 is seated (4F) in a second groove, and the second heat pipe 120 is press-fitted (4G) by pressing the second heat pipe 120 with a jig. The process of mounting the second heat pipe 120 may be performed through the processes of FIGS. 5 and 7, like the first heat pipe 110. That is, a locking portion for preventing the second heat pipe 120 from being separated in a direction toward the second surface 150 may be formed in a second groove. Then, the second surface 150 on which the second heat pipe 120 is mounted is flattened and compensated (4H) through numerical control cutting, and a heat sink 100 is manufactured by forming a third groove 140 through numerical control cutting so that the heating component can be seated on the first surface 130. At this time, according to claim 1, the third groove 140 may be formed to be spaced apart from the first heat pipe 110 by a predetermined distance or more. As shown in FIG. 8, the third groove 140 may be formed to be spaced apart from the first heat pipe 110 at an interval of d or more. This is to prevent the first heat pipe 110 from being damaged during numerically controlled cutting to form the third groove 140, and d may be 1 mm or more.

A method for manufacturing a heat sink according to an embodiment of the present invention comprises the steps of: forming a first groove in which a first heat pipe is mounted on a first surface of a heat sink; mounting the first heat pipe on the first surface by disposing the first heat pipe in the first groove and press-fitting; forming a second groove in which a second heat pipe is mounted on a second surface of the heat sink; mounting the second heat pipe on the second surface by disposing the second heat pipe in the second groove and press-fitting it; and forming a third groove such that at least a portion of the second heat pipe is exposed in a direction toward the first surface.

A detailed description of each step corresponds to the detailed description of the heat sink 100 described previously, and an overlapping description will be omitted hereinafter.

In forming the first groove or the second groove, it may include the steps of: forming a locking portion by undercutting the first groove in a direction toward the first surface; and forming a locking portion by undercutting the second groove in a direction toward the second surface.

In addition, the step of forming the third groove may form the third groove such that the first heat pipe and the second heat pipe have a step difference in a direction toward the first surface, and may form the third groove to be spaced apart from the first heat pipe by a predetermined distance or more.

At least one among the first groove, the second groove, and the third groove may be formed by performing numerical control (NC) cutting. It is natural that the grooves can be formed in various ways other than numerically controlled cutting.

As described above, in the present invention, specific matters such as specific components, and the like; and limited embodiments and drawings have been described, but these are only provided to help a more general understanding of the present invention, and the present invention is not limited to the above embodiments, and various modifications and variations are possible from these descriptions by those of ordinary skill in the art to which the present invention belongs.

Therefore, the spirit of the present invention should not be limited to the described embodiments, and not only the claims to be described later, but also all those with equivalent or equivalent modifications to the claims will be said to belong to the scope of the spirit of the present invention.

The invention claimed is:

1. A heat sink comprising:
a first heat pipe mounted in a first groove formed in a first surface of the heat sink;
a second heat pipe mounted in a second groove formed in a second surface of the heat sink; and
a third groove in which at least a portion of the second heat pipe mounted in the second groove is exposed in a direction toward the first surface,
wherein the first heat pipe and the second heat pipe have a step difference in a direction toward the first surface.

2. The heat sink according to claim 1,
wherein when the heat sink is applied to a product,
the first heat pipe is in contact with a first heating component in the first surface, and
wherein the second heat pipe is in contact with a second heating component through the third groove.

3. The heat sink according to claim 2,
wherein the third groove is formed to be greater than or equal to an area of a surface of the second heating component being in contact with the second heat pipe.

4. The heat sink according to claim 3,
wherein a depth of the third groove is composed according to a height difference between the first heating component and the second heating component.

5. The heat sink according to claim 2,
wherein a height of the first heating component is lower than a height of the second heating component.

6. The heat sink according to claim 1,
wherein the first heat pipe and the third groove are spaced apart from each other by a predetermined distance or more.

7. The heat sink according to claim 1,
wherein the first groove comprises a locking portion for preventing the first heat pipe from being separated in a direction toward the first surface, and
wherein the second groove comprises a locking portion for preventing the second heat pipe from being separated in a direction toward the second surface.

8. The heat sink according to claim 1,
wherein a cross-sectional area of the first groove is formed to be the same as a cross-sectional area of the first heat pipe.

9. The heat sink according to claim 1,
wherein a cross-sectional area of the first groove is formed to be larger than a cross-sectional area of the first heat pipe by a predetermined area.

10. A method for manufacturing a heat sink comprising steps of:
forming a first groove in which a first heat pipe is mounted in a first surface of a heat sink;
mounting the first heat pipe in the first surface by disposing the first heat pipe in the first groove and press-fitting the first heat pipe;
forming a second groove in which a second heat pipe is mounted in a second surface of the heat sink;
mounting the second heat pipe in the second surface by disposing the second heat pipe in the second groove and press-fitting the second heat pipe; and
forming a third groove such that at least a portion of the second heat pipe is exposed toward a direction of the first surface,
wherein in the step of forming the third groove, the third groove is formed so that the first heat pipe and the second heat pipe have a step difference in a direction toward the first surface.

11. The method for manufacturing a heat sink according to claim 10 comprising steps of:
forming a locking portion by undercutting the first groove in a direction toward the first surface; and
forming a locking portion by undercutting the second groove in a direction toward the second surface.

12. The method for manufacturing a heat sink according to claim 10,
wherein in the step of forming the third groove, the third groove is formed to be spaced apart from the first heat pipe by a predetermined distance or more.

13. The method for manufacturing a heat sink according to claim 10,
wherein at least one among the first groove, the second groove, and the third groove is formed by performing numerical control (NC) cutting.

14. The method for manufacturing a heat sink according to claim 10,
wherein when the heat sink is applied to a product,
the first heat pipe is in contact with a first heating component in the first surface, and
wherein the second heat pipe is in contact with a second heating component through the third groove.

15. The method for manufacturing a heat sink according to claim 14,
wherein the third groove is formed to be greater than or equal to an area of a surface of the second heating component being in contact with the second heat pipe.

16. The method for manufacturing a heat sink according to claim 15,
wherein a depth of the third groove is composed according to a height difference between the first heating component and the second heating component.

17. The method for manufacturing a heat sink according to claim 10,
wherein the first heat pipe and the third groove are spaced apart from each other by a predetermined distance or more.

18. The method for manufacturing a heat sink according to claim 10,
wherein a cross-sectional area of the first groove is formed to be the same as a cross-sectional area of the first heat pipe.

* * * * *